United States Patent [19]
Javanifard

[11] Patent Number: 5,430,674
[45] Date of Patent: Jul. 4, 1995

[54] METHOD AND APPARATUS FOR SEQUENTIAL PROGRAMMING OF A FLASH EEPROM MEMORY ARRAY

[75] Inventor: Johnny Javanifard, Sacramento, Calif.

[73] Assignee: Intel Corporation, Santa Clara, Calif.

[21] Appl. No.: 252,850

[22] Filed: Jun. 2, 1994

Related U.S. Application Data

[63] Continuation-in-part of Ser. No. 119,520, Sep. 10, 1993.

[51] Int. Cl.⁶ .................................................. G11C 8/00
[52] U.S. Cl. ................................... 365/185; 365/218; 365/900
[58] Field of Search ........... 365/218, 185, 900, 189.04, 365/189.09, 220, 227, 189.01

[56] References Cited

U.S. PATENT DOCUMENTS

| | | | |
|---|---|---|---|
| 4,949,308 | 8/1990 | Araki et al. | 365/218 |
| 5,047,985 | 9/1991 | Miyaji | 365/203 |
| 5,235,545 | 8/1993 | McLaury | 365/218 |
| 5,263,000 | 11/1993 | Van Buskirk et al. | 365/226 |
| 5,282,170 | 1/1994 | Van Buskirk et al. | 365/226 |

*Primary Examiner*—David C. Nelms
*Assistant Examiner*—Vu Le
*Attorney, Agent, or Firm*—Blakely, Sokoloff, Taylor & Zafman

[57] ABSTRACT

An integrated circuit arrangement for providing programming voltages to a flash EEPROM memory array including an arrangement for selecting only bits of a word which are to be programmed and applying programming voltages only to the memory transistors of a selected subset of those bits to be programmed until all bits to be programmed in a word have been programmed.

19 Claims, 6 Drawing Sheets

Figure 5

- 58 Flash EEPROM Memory Array
- 57 Col. Decode
- 53 Charge Pump
- 54 Comparator — Data word being programmed
- 56 Processor
- 52

METHOD AND APPARATUS FOR SEQUENTIAL PROGRAMMING OF A FLASH EEPROM MEMORY ARRAY

This is a continuation in part of U.S. Pat. No. 119,520 filed Sep. 10, 1993.

BACKGROUND OF THE INVENTION

1. Field Of The Invention

This invention relates to computer systems and, more particularly, to methods and apparatus for the intelligent sequentially programming of memory cells in a flash electrically-erasable programmable read only memory (flash EEPROM) array in order to reduce the current and power utilized and to increase the speed of operation.

2. History Of The Prior Art

This application is a continuation-in-part of U.S. patent application Ser. No. 08/119,520 entitled, Method and Apparatus For Sequential Programming of the Bits in a Word of a Flash EEPROM Memory Array, E. Larson and J. Javanifard, filed Sep. 10, 1993, and assigned to the assignee of the present invention. There has been a recent trend toward lowering the power requirements of portable computers. In order to reduce power consumption, much of the integrated circuitry used in personal computers is being redesigned to run at low voltage levels. The circuitry and components used in portable computers are being designed to operate at voltage levels such as 5 volts and 3.3 volts in order to use less current. This helps a great deal to reduce the power needs of such computers.

However, some of the features of portable computers require higher voltages. Recently, flash electrically-erasable programmable read only memory (flash EEPROM memory) has been used to store BIOS processes.

This memory may be erased and reprogrammed without removing the BIOS circuitry from the computer by running a small update program when the BIOS processes are changed. Other versions of flash EEPROM memory are being used for long term storage in place of electro-mechanical hard disk drives. However, erasing and reprogramming flash EEPROM memory typically requires approximately twelve volts to accomplish effectively; and the lower voltage batteries provided in portable computers, in general, are not capable of furnishing this voltage with sufficient current to accomplish the operations.

Typically, charge pump circuits have been used to provide a high voltage from a lower voltage source. However, the positive source method of erasing flash EEPROM memories draws a very substantial amount of current. Similarly, programming such arrays using traditional techniques has required large amounts of current. Charge pumps furnishing such voltages with sufficient current typically utilize large capacitors which require a large amount of die space. Recently it has been discovered that using specially designed charge pumps sufficient current can be generated to accomplish positive source erase and the programming of flash EEPROM memory arrays. A charge pump arrangement for accomplishing positive source erase is disclosed in detail in U.S. patent application Ser. No. 08/119,423, entitled Method And Apparatus For A Two Phase Bootstrap Charge Pump, K. Tedrow et al, filed on Sep. 10, 1993, and assigned to the assignee of the present invention.

It is still desirable, even using advanced charge pumps, to reduce the amount of current used in programming flash EEPROM memory arrays.

A flash EEPROM memory array is made up of memory cells which include floating gate field effect transistor devices. The N type memory transistors may be programmed by storing a negative charge on the floating gate. A negative charge on the floating gate shifts the threshold voltage of the memory transistor making it less conductive. The condition of the memory transistors (programmed or erased) may be detected by interrogating the cells and sensing whether current flows or not. The programming of memory cells is typically accomplished a word at a time but conventionally requires that the drain of selected cells be placed at six or seven volts, the gate at eleven or twelve volts, and the source at ground. This programming operation draws substantial current because the gate terminal is raised above the level of the drain and source terminals while a significant potential difference is placed between the drain and source terminals.

The simultaneous programming of each bit of a sixteen bit word requires approximately one milliampere of current so that programming one word draws approximately sixteen milliamperes. The peak current drawn during the conventional programming operation may be as high as forty milliamperes. This is a very large amount of current and requires larger charge pumps with larger capacitances which require a large amount of die space and therefore tend to increase rather than decrease the size of components used in portable computers. Moreover, integrated circuit charge pumps cannot be made to operate as efficiently as can stand alone charge pumps because they do not make use of elements such as inductors which maximize efficiency. In fact, such charge pumps operate at efficiencies of approximately forty percent so that, for example, seventy-two milliamperes of peak current are required to supply the sixteen milliamperes necessary for programming a word.

For this reason, apparatus and methods which reduce current requirements for programming flash EEPROM memory arrays are very desirable.

SUMMARY OF THE INVENTION

It is, therefore, an object of the present invention to reduce the overall current requirements of integrated circuits.

It is another object of the present invention to provide an intelligent arrangement for reducing the current requirements for programming flash EEPROM memory arrays.

It is an additional object of the present invention to provide an arrangement for reducing the currents necessary for programming flash EEPROM memory arrays to a level where such currents may be furnished by integrated circuit charge pump circuitry using a small amount of die space.

These and other objects of the present invention are realized in an integrated circuit arrangement for providing programming voltages to a flash EEPROM memory array including an arrangement for selecting only those bits of a word which are to be programmed and applying programming voltages only to the memory, transistors of a selected subset of those bits to be programmed until all bits to be programmed in a word have been programmed. Such and arrangement and method reduce the current requirements and the time required for programming in such a memory array.

These and other objects and features of the invention will be better understood by reference to the detailed description which follows taken together with the drawings in which like elements are referred to by like designations throughout the several views.

BRIEF DESCRIPTION OF THE DRAWINGS

FIG. 5 is a block diagram illustrating an arrangement for programming a flash EEPROM memory array in accordance with the present invention.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus and to a method for operating a computer in processing electrical or other (e.g. mechanical, chemical) physical signals to generate other desired physical signals.

DETAILED DESCRIPTION

Figure 1:
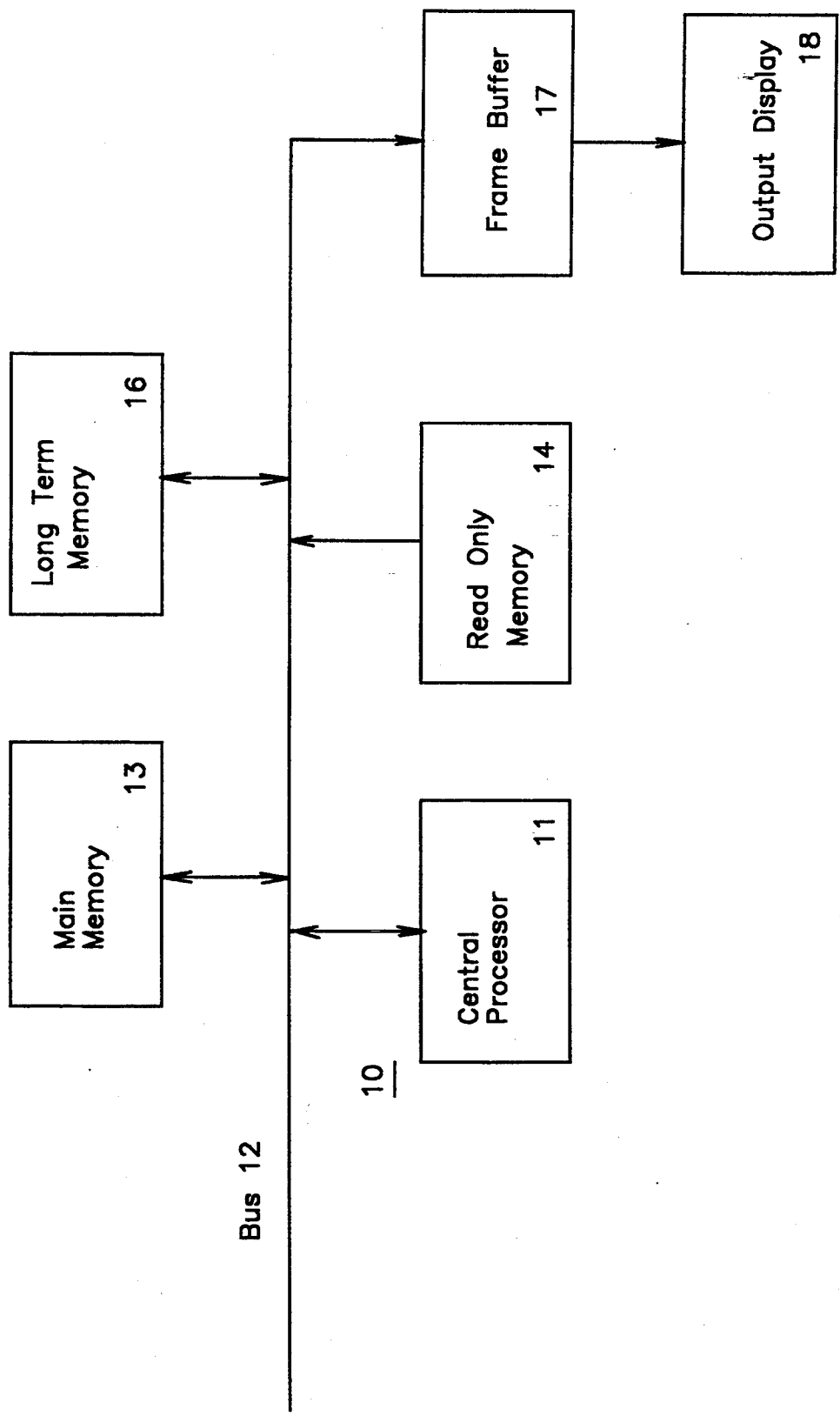
FIG. 1 is a block diagram illustrating a computer system which may utilize the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes. Such memory 14 may be constructed of flash EEPROM memory cells adapted to be modified as various ones of the BIOS processes used by a particular computer are changed. If the memory 14 is constructed of flash EEPROM memory cells, it may be modified by running an update process on the computer itself to reprogram the values stored in the memory 14. Typically, such flash EEPROM memory will include circuitry for programming and erasing the memory array in order to allow such an update to occur.

Also connected to the bus 12 are various peripheral components such as long term memory 16 and circuitry such as a frame buffer 17 to which data may be written which is to be transferred to an output device such as a monitor 18 for display. Rather than the typical electromechanical hard disk drive, a flash EEPROM memory array may be used as the long term memory 16. Such flash EEPROM memory arrays typically include circuitry for programming and erasing the memory arrays. Since programming and erasing utilize voltages greater than those typically available to the integrated circuits of more advanced portable computers, in accordance with the present invention, such long term memory arrays may provide circuitry for generating high voltages from the lower voltages available from the batteries typically utilized with such computers. One particular arrangement for providing long term memory using flash EEPROM memory cells is described in U.S. patent application Ser. No. 07/969,131, entitled A Method and Circuitry For A Solid State Memory Disk, S. Wells, filed Oct. 31, 1992, and assigned to the assignee of the present invention.

A peculiarity of flash EEPROM arises from the fact that it is not reprogrammable until it has been erased. Moreover, the typical operating voltages available in a portable computer system are insufficient to erase the transistors of a flash EEPROM array but can only switch (program) those transistors from a one to a zero condition. The condition can be reversed to a one only by applying a voltage (usually twelve volts) higher than typical operating voltages to the source terminals of the memory transistors.

The conventional method of erasing an array of flash EEPROM memory cells (called positive source erase) erases all of the cells together (or at least some large block thereof). When the cells of a block of an array of flash EEPROM memory cells are all erased, they are placed in the condition in which no charge is stored on the floating gate and in which interrogation will produce a one value prior to data being first stored in the array. This is accomplished in a two step process. First, all of the cells in the one condition are programmed to the zero condition; and then the entire block is erased by applying the high voltage at the source terminals of all of the cells to place all of the cells in the one condition. Once the cells have been erased, all of the memory cells are in the one condition. As data is stored in the memory cells of the block, those cells which are to store a one condition remain in the condition in which they were placed when erased while those cells which are to store a zero condition are switched to the programmed condition. Consequently, whenever a portion of a flash EEPROM memory array is programmed, only those cells which are to be placed in the zero condition are switched. Moreover, once programmed, the data stored cannot be changed until the entire block of memory is once again erased.

It is difficult to provide sufficient current to effectively erase and program flash EEPROM memory when erased in the manner described above. For this reason, circuits for programming and erasing which require smaller amounts of currents are desirable.

Figure 2:
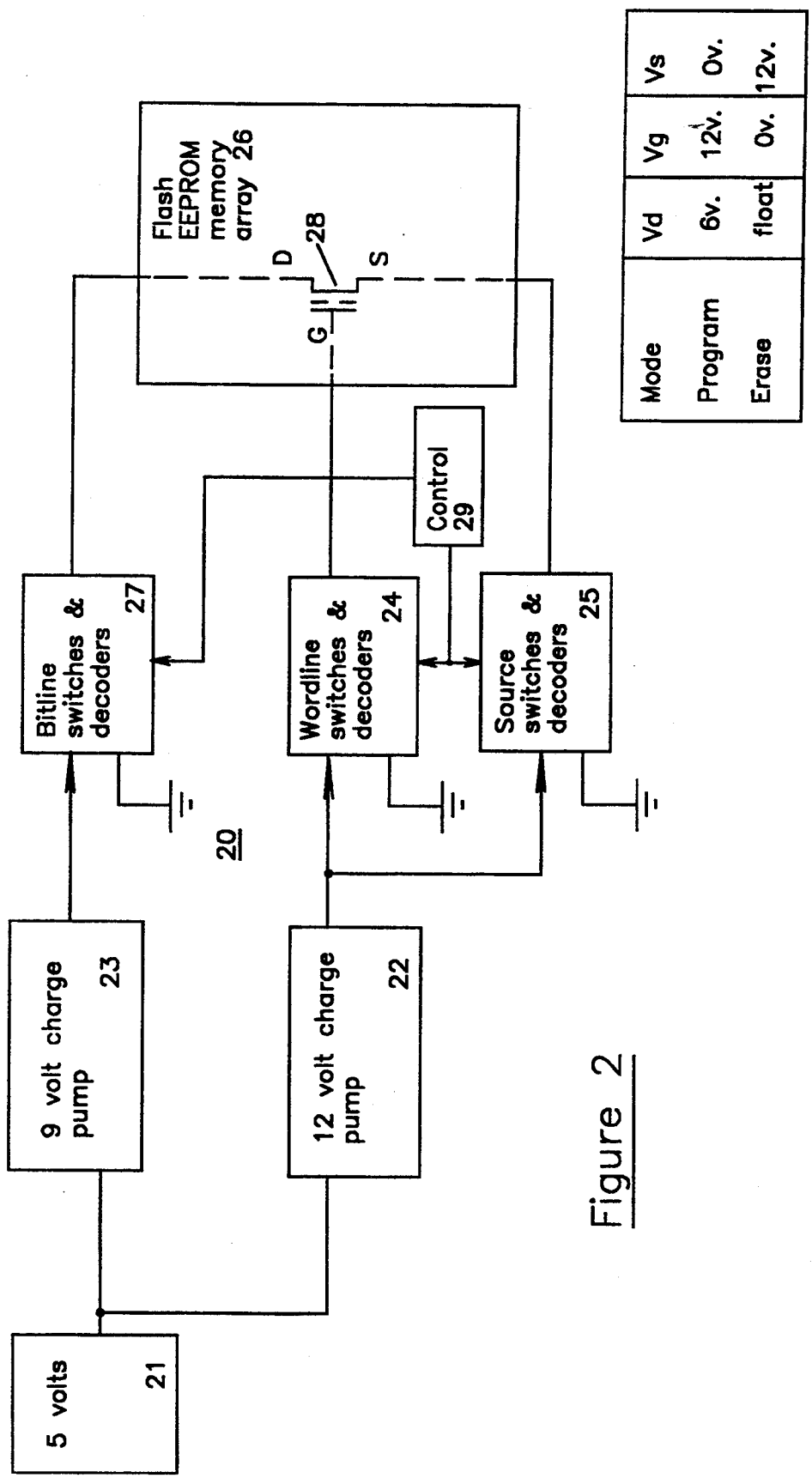
FIG. 2 is a block diagram of a circuit for providing programing and erase voltages for flash EEPROM memory arrays.

FIG. 2 is a block diagram which illustrates an integrated circuit 20 including a flash EEPROM memory array 26 and circuitry for programming and erasing the flash EEPROM memory array 26 utilizing positive source erase techniques. This circuit 20 includes a source of voltage 21 such as a low powered battery capable of furnishing five volts. Voltage from the source 21 is provided to a pair of charge pump circuits 22 and 23. The charge pump circuit 22 is devised to provide a pumped output voltage of approximately twelve volts while the charge pump circuit 23 is devised to produce a pumped output voltage of approximately nine volts.

Voltage from the charge pump 22 is furnished to a set of wordline switches and decoders 24 which, in a manner well known to those skilled in the art, provide voltages at the gate terminals of flash EEPROM memory transistor devices 28 (only one transistor device 28 is illustrated in FIG. 2). Voltage from the pump 22 is also furnished to a set of source switches and decoders 25 which, in a manner well known to those skilled in the art, provide voltages at the source terminals of flash EEPROM memory transistor devices 28. The voltage furnished by the pump 23 is furnished to a set of bitline switches and decoders 27 which, in a manner well known to those skilled in the art, provide voltages at the drain terminals of flash EEPROM memory transistor devices 28. Each of the sets of switches and decoders 24, 25, and 27 is controlled by signals from a control circuit 29 to provide appropriate voltages at erase and programming to accomplish those results. In one embodiment, the control circuit 29 is a microprocessor designed to provide control of all of the operations of the memory array 26 including reading, programming, and erasing among other things. The use of such a control circuit is described in U.S. patent application Ser. No. 08/086,186, entitled Flash Memory Array System And Method, M. Fandrich et al, filed Jun. 30, 1993, and assigned to the assignee of the present invention.

At the lower right corner of FIG. 2 is shown a table which illustrates the voltages which are typically applied to the terminals of the memory cells during the program and erase operations using positive source erase techniques. As may be seen, the erasing of the memory device 28 requires that a positive twelve volts be applied to the source terminal of the device 28, ground be applied to the gate terminal, and the drain be floated. During programming, on the other hand, the source is typically grounded while twelve volts is applied to the gate terminal and six or seven volts is applied to the drain terminal. Because the gate terminal is raised to a potential greater than either the source or drain terminals and a substantial potential is applied between source and drain terminals, substantial drain current will flow. Because of this substantial drain current when programming is conducted, the source of the programming voltage must be able to furnish a substantial amount of current. Those skilled in the art have felt that it is quite difficult to furnish a sufficient amount of current for this purpose using a charge pump without the need to utilize an inordinate amount of die space for capacitors.

Figure 3:
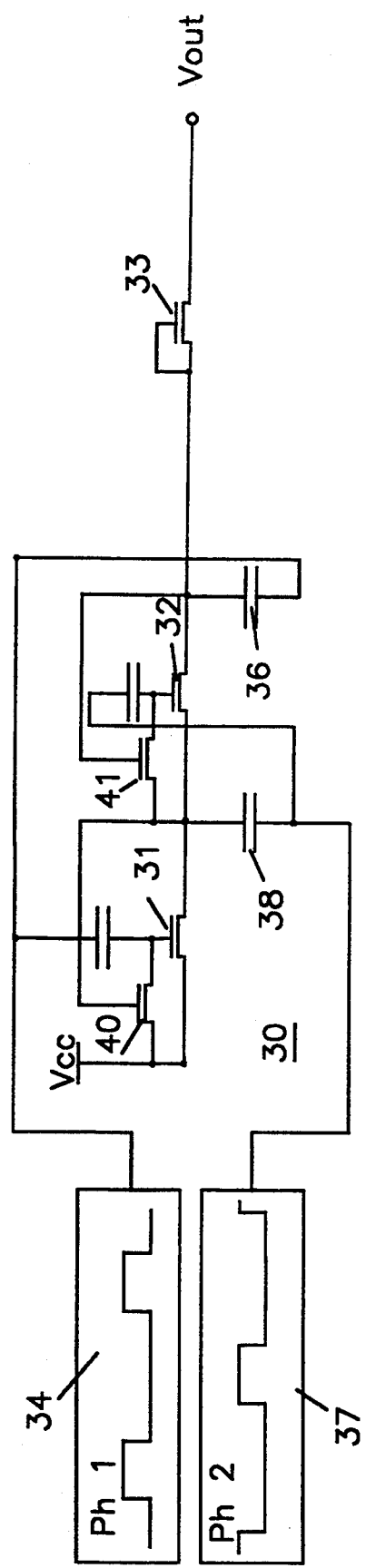
FIG. 3 is a block diagram of a charge pump which may be used in the circuit of FIG. 2 to provide voltages and currents sufficient for positive source erase techniques.

FIG. 3 illustrates a bootstrap charge pump arrangement 30 as described in the U.S. patent application, entitled Method And Apparatus For A Two Phase Bootstrap Charge Pump, referred to above. This charge pump 30 may be utilized to provide the high voltages required for programming and erasing flash EEPROM memory arrays. As is shown in FIG. 3, the pump 30 includes three stages of N type field effect transistor devices 31, 32, and 33 each having drain and source terminals connected in series between a source of voltage Vcc and an output terminal Vout. A first set of input clock signals are furnished to the circuit 30 from a source of clock signals 34 by capacitors 35 and 36. A second set of input clock signals are furnished from a source of clock signals 37 via capacitors 38 and 39. Each stage of the circuit 30 includes a N channel field effect transistor device 40 or 41 providing a path between source and drain terminals to the gate terminal of the associated device 31 or 32 of that stage. The pump 30 illustrated is a two stage pump which may be used as the pump 23 illustrated in FIG. 2 to generate programming voltages for the drain of the device 28.

The two phases of non-overlapping input clock pulses (phase 1 and phase 2) produced by the sources 34 and 37 are applied to the circuit 30 to produce the desired output voltages and currents. The phase 2 clock is high initially so that enabling signals are applied to the gate terminal of the control device 40 and to the gate terminal of switching device 32. The high voltage turns on the control device 40. The high voltage from the source 37 is also applied at the drain of the device 32, and the high voltages at both the drain and gate of the device 32 cause it to turn on.

When the device 32 turns on, its drain and gate are initially at the same value due to conduction of the device 41 during the immediately preceding period in which the phase 1 clock signal was high. However, since the phase 1 clock is now low, the control device 41 joining the drain and gate of the device 32 is off. After the device 32 has been on for any significant portion of the high voltage phase of the clock 2 period, the high voltage at the drain transfers charge from the capacitor 38 to the capacitor 36, reducing the voltage level at the drain of the device 32. Thus the voltage at the gate of the device 32 is higher than at either the drain or the source; and the device 32 switches completely on without any threshold voltage drop. Thus, the transfer of charge from the capacitor 38 to the capacitor 36 does not dissipate power due to a threshold drop.

When the phase 2 clock pulse goes low, the drain of the device 41 drops lower than the gate; and the device 41 turns on. Simultaneously, the gate terminal of the control device 40 is lowered turning off the device 40 so that the drain and gate terminals of the device 31 are isolated from each other but at the same voltage. The lowering of the voltage at the gate of the device 32 when the phase 2 pulse goes low causes the device 32 to begin to turn off. When the phase 1 clock pulse goes high, the device 41 switches completely on and equalizes the voltage at the gate and drain of the device 32. At the same time, the gate terminal of the device 31 is raised by the value Vcc.

The device 31 functions similarly to the device 32 in transferring charge to the capacitor 38. The gate and drain terminals of this device are initially equal when the device 40 is on, but then the drain voltage and source voltage equalize as charge is transferred to the capacitor 38 so that the device 31 is switched completely on anti experiences no threshold voltage drop.

Thus, when the phase 1 clock goes high, the device 31 turns on; and current provided by the source Vcc charges the capacitor 38. When the phase 1 pulse goes low the device 31 switches off. Then the phase 2 clock pulse turns on the device 32; and the capacitor 38 provides stored charge and charge provided by the phase 2 pulse to the capacitor 36. The device 32 switches off when the phase 2 pulse goes low. When the phase 1 pulse again goes high, the source Vcc again charges the capacitor 38.

Ultimately, the charging of the capacitor 36 and the positive swing of the phase 2 clock pulse raise the voltage level on the capacitor 36 sufficiently above the level Vout to cause the conduction of the switching device 33. When the phase 1 clock goes high, the output device 33 turns on and furnishes a pumped voltage at Vout. It should be noted that the last stage operates in a range in which it exhibits a Vt drop.

This operation provides the desired output voltage while furnishing the high level of current necessary to erase and program flash EEPROM memory arrays. The two stage pump circuit 30 illustrated in FIG. 3 furnishes approximately N (where N is the number of stages) plus one times the voltage of the source Vcc less the Vt drop of the device 33 as open circuit voltage at the output terminal. For example, with Vcc equal to 4.4 volts, an output voltage of 12.7 volts is furnished at the output of the pump circuit 30. Thus, as may be seen, the arrangement of FIG. 3 provides a reliable charge pump circuit capable of producing high levels of current.

The pump 30 illustrated in FIG. 3 may be used to furnish the source voltage during erase and the gate voltage during programming of the memory cells by increasing its size. The larger charge pump 22 of FIG. 2 required to furnish the voltage used at the source terminals and the gate terminals of the flash EEPROM memory cells during erasing and programming, respectively, of the array may be provided by a charge pump in which one more stage is used.

Even though the charge pump circuit of FIG. 3 provides output voltages and currents which are substantially greater than those provided by prior art charge pumps, programming and erasing flash EEPROM memory arrays both draw a large amount of current and, therefore, would benefit from the use of techniques by which the total amount of current used is reduced.

To assure that there is sufficient current available to program the memory cells of the array illustrated in FIG. 2, an arrangement is provided in which smaller amounts of current are required. In order to reduce the current used in programming the memory cells of the flash EEPROM memory array, a circuit has been provided in which the bits of a word are programmed sequentially in subgroups, e.g., four bits at a time. Thus, rather than programming all of the bits of a word simultaneously as has been done in prior art arrangements, a lesser number of bits is programmed so that less instantaneous and peak current is required during any programming operation. In this manner, rather than sixteen milliamperes being required at once to program the array, only four milliamperes are required at any instant. Consequently, both the average and peak currents are reduced to values which may be conveniently provided by the charge pump circuits illustrated.

In order to reduce the current required at the output of the charge pump 30 of FIG. 3, the output voltage provided by the charge pump 30 is connected to provide the drain voltage necessary to program some subportion of a word. In an embodiment illustrated in FIG. 4, the output of the charge pump is furnished in sequence to subsets of four bitlines by sets of switches which cooperate with the column decoding circuitry. In this manner, a charge pump need only provide sufficient current to program four memory cells simultaneously. Operating in this manner requires only approximately four milliamperes of average programming current during any programming interval rather than the sixteen milliamperes which is typical of prior art arrangements. It will be understood that the number of bits selected in a subset to be programmed is a function of the current capacity of a particular charge pump which in turn depends upon the size of the charge pump circuit elements. In particular cases, either more or fewer bits of a word might be programmed.

Figure 4:
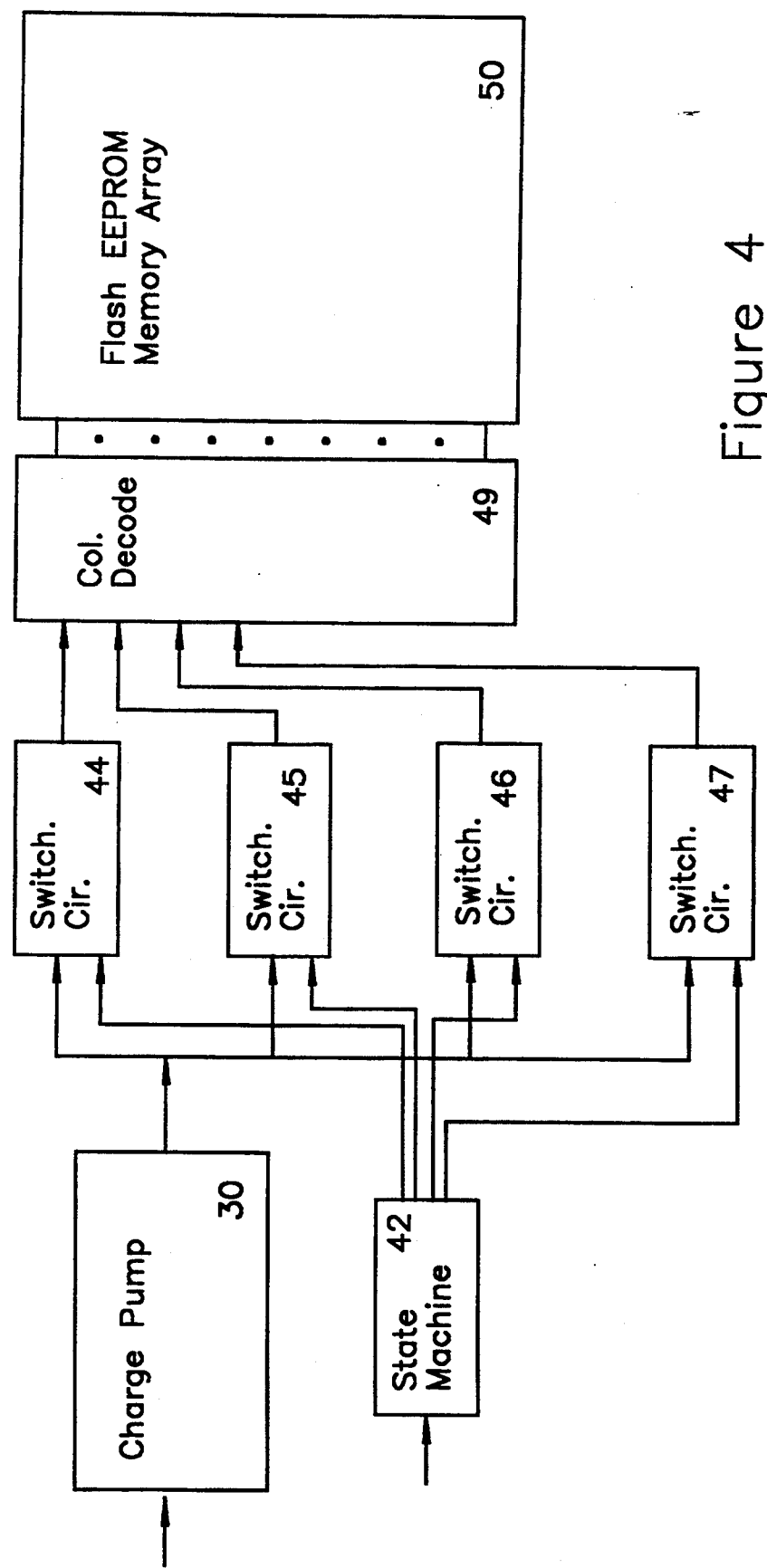
FIG. 4 is a block diagram of a circuit in accordance with the present invention for controlling the output voltage of a charge pump such as that illustrated in FIG. 3.

As illustrated in FIG. 4, a charge pump 30 provides an output voltage and current which is used for programming a word of the memory array. The output voltage is provided to four individual switching circuits 44–47. Each of these switching circuits 44–47 receives input control signals from a state machine 42 which enable the connection of the voltage provided at the output of the charge pump to one after another of the four sets of bitlines selected at the output of the switching circuits 44–47 in sequence. The state machine sends enabling signals to the switching circuits 44–47 in a constant sequence which repeats for each word which is programmed. Other circuitry such as a controller circuit, a processor, or some other method of generating a sequence of pulses may be used in place of the state machine in particular embodiments to furnish the enabling signals. Consequently, a first enable signal is generated by the state machine 42 and transferred to the first switching circuit 44 of the individual switching circuits 44–47. The circuit 44 controls, for example, the transfer of voltage to bits 0 through 3 of the word selected to be programmed. It will be understood that other sequences of bits such as 0, 4, 8, 12 might as well be chosen in any particular arrangement. This first enable signal allows the voltage provided by the charge pump 30 to be applied to the four bitlines connected to that switching circuit 44–47 which are to be programmed for transfer to the drain terminals of the memory devices. In each case, the actual bitlines to be programmed are selected by the column decoding circuitry 49. Once the appropriate ones of the bitlines of the first subset of bitlines have received the appropriate high voltage from the charge pump 30 and programming has occurred, another (second) enable signal is generated by the state machine 42 and transferred to the second of the individual switching circuits 45 so that the voltage provided by the charge pump 30 may be applied to those ones of the four bitlines (for example, bits 4 through 7 of the selected word being programmed) connected to that switching circuit 45 which are to be programmed. This generation of enabling pulses and programming of sets of four bitlines continues in sequence through the subsets of four bits of selected words until all of the bits of the word have been programmed. After each set of four bits, a test may be run to determine whether additional sets of bits exist in the word which are yet to be programmed. After the word has been programmed, its programming may be verified by testing data in the memory positions against the data provided for programming. The method for verifying the testing is explained in the U.S. patent application entitled Flash Memory Array System and Method, referred to above. The enabling cycle is repeated for sequential subsets of bits with the next data word and with each other data word to be programmed. This method of programming substantially reduces the current required from a charge pump to accomplish programming.

Figure 6:
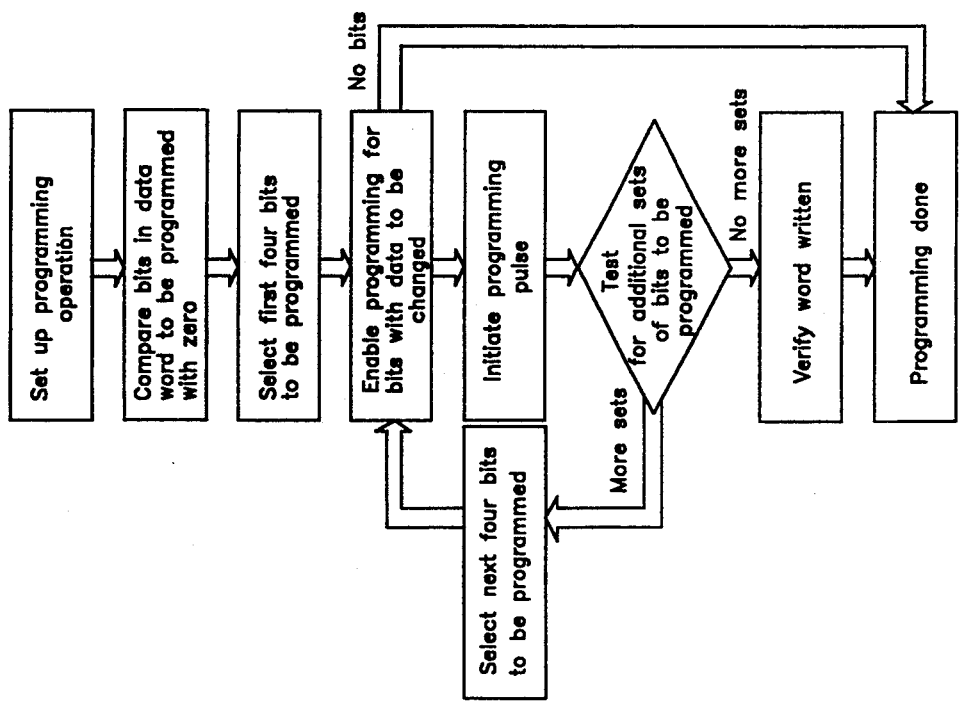
FIG. 6 is a flow chart illustrating a first method of practicing the present invention.

An improved arrangement and method for programming flash EEPROM memory arrays is illustrated in FIGS. 5 and 6. The arrangement 52 includes a charge pump 53 which furnishes a voltage with current sufficient to program at least four individual bits of a word. The particular word to be programmed is provided to a comparator 54. The comparator 54 compares each of the individual bits of the word to zero and provides an output to a processor 56. The processor 56 can also be an application specific logic circuit. The processor 56 selects those bits for which the comparator provides a zero valued output to be programmed in groups of four beginning with least significant bit. The processor furnishes these values to column decode circuitry 57 so that appropriate bits in a particular word will be programmed. As pointed out above, since a flash memory array is only programmed after all of the memory cells of the particular block of the array have been erased by being placed in the one condition, only those values to be programmed to zero values are affected by this form of selective programming.

This arrangement 52 conserves substantially more energy than does the previously explained version and operates more rapidly but requires that some means such as a general purpose processor or an application specific logic circuit be available for making decisions which are discussed above. Essentially, the method comprises examining the data which is presented in each word which is to be programmed, comparing the datum in each bit position with a zero value, selecting a first group such as four bits each of which is to be programmed with a zero value wherever the bits reside in the word, programming those bits, then moving to the next group of four bits all of which are to be programmed, and programming those bits. The method continues in the manner explained until all of the bits of the word which are to be programmed have been programmed. All will be understood, since only the bits which are to be programmed to zero are selected for simultaneous programming and the other bits are completely skipped, there may be only one or two or three individual programming steps taken instead of four steps as in the previously discussed version. Consequently, the time required to program a word is on an average much less than in the prior arrangement in which only the bits in fixed groups of four were programmed. After a first word is programmed, the next word to be programmed is selected, the bits of that word are each tested against zero to determined which bits need to be programmed, and the bits of that next word are programmed in groups of, for example, four bits at a time.

Using this method, the bits of a word to be programmed are divided into groups to be programmed depending on the results of the comparison without the necessity to divide the programming along fixed subboundaries. As will be understood, it is likely that the number of bits to be programmed in any sixteen bit word will average half of those bits. Consequently, the actual programming operation will require a smaller number of sequential steps in which four bits are programmed together in each step. As will be appreciated, this allows the time for programming to be drastically reduced since the individual bits being programmed in any particular operation may reside in any order in the word. This method so reduces the total, peak, and average currents required for the programming operation since the entire operation may be accomplished many fewer times than is necessary in the previous embodiment.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A computer system comprising:
   a central processor;
   a memory arrangement that further comprises
      a flash EEPROM memory array including a plurality of floating gate field effect transistor devices,
      a charge pump for providing a first positive voltage to be applied to drain terminals of the floating gate field effect transistor devices during a programming operation,
      a comparator connected to receive a data word to be programmed into the flash EEPROM memory array for comparing each bit of the data word with a predetermined voltage in order to generate output signals indicating which bits of the data word need to be programmed,
      control circuitry responding to the output signals from the comparator for allowing a selected number of the plurality of floating gate field effect transistor devices corresponding to a portion of the bits of the data word that need to be programmed to receive the voltage from the charge pump; and
   a system bus for transferring data and addresses between the central processor and the memory arrangement.

2. A computer system as claimed in claim 1 in which the control circuitry is a processor which allows groups of the selected number of floating gate field effect transistor devices to be programmed to receive the voltage from the charge pump one group after another until the data word has been programmed.

3. A computer system as claimed in claim 1 in which the selected number is four.

4. A computer system as claimed in claim 1 in which the control circuitry is an application specific logic circuit which allows groups of the selected number of floating gate field effect transistor devices to be programmed to receive the voltage from the charge pump one group after another until yhe data word has been programmed.

5. A memory arrangement comprising:
a flash EEPROM memory array including a plurality of floating gate field effect transistor devices,
a charge pump for providing a first positive voltage to be applied to drain terminals of the floating gate field effect transistor devices during a programming operation,
a comparator connected to receive a data word to be programmed into the flash EEPROM memory array for comparing each bit of the data word with a predetermined voltage in order to generate output signals indicating which bits of the data word need to be programmed, and
control circuitry responding to the output signals from the comparator for allowing a selected number of the plurality of floating gate field effect transistor devices corresponding to a portion of the bits of the data word that need to be programmed to receive the voltage from the charge pump.

6. A memory arrangement as claimed in claim 5 in which the control circuitry is a processor which allows groups of the selected number of floating gate field effect transistor devices to be programmed to receive the voltage from the charge pump one group after another until the data word has been programmed.

7. A memory arrangement as claimed in claim 5 in which the selected number is four.

8. A memory arrangement as claimed in claim 5 in which the control circuitry is an application specific logic circuit which allows groups of the selected number of floating gate field effect transistor devices to be programmed to receive the voltage from the charge pump one group after another until the data word has been programmed.

9. A computer system comprising:
central processing means;
means for providing storage of data, further comprising
flash EEPROM memory array means including a plurality of floating gate field effect transistor devices,
charge pump means for providing a first positive voltage to be applied to drain terminals of the floating gate field effect transistor devices during a programming operation,
means for comparing each bit of a data word to be programmed into the flash EEPROM memory array with a predetermined voltage in order to generate output signals indicating which bits of the data word need to be programmed,
control means responding to the output signals from the means for comparing for allowing a selected number of the plurality of floating gate field effect transistor devices corresponding to a portion of the bits of the data word that need to be programmed to receive the voltage from the charge pump; and
system bus means for transferring data and addresses between the central processing means and the means for providing storage for data.

10. A computer system as claimed in claim 9 in which the control means includes processor means which allows groups of the selected number of floating gate field effect transistor devices to be programmed to receive the voltage from the charge pump means one group after another until the data word has been programmed.

11. A computer system as claimed in claim 9 in which the selected number is four.

12. A computer system as claimed in claim 9 in which the control means includes application specific logic means which allows groups of the selected number of floating gate field effect transistor devices to be programmed to receive the voltage from the charge pump means one group after another until the data word has been programmed.

13. An arrangement for providing storage of data comprising:
flash EEPROM memory array means including a plurality of floating gate field effect transistor devices,
charge pump means for providing a voltage to be applied to terminals of the floating gate field effect transistor devices during a programming operation,
means for comparing each bit of a data word to be programmed into the flash EEPROM memory array with a predetermined voltage in order to generate output signals indicating which bits of the data word need to be programmed, and
control means responding to the output signals from the means for comparing for allowing a selected number of the plurality of floating gate field effect transistor devices corresponding to a portion of the bits of the data word that need to be programmed to receive the voltage from the charge pump.

14. An arrangement for providing storage of data as claimed in claim 13 in which the control means includes processor means which allows groups of the selected number of floating gate field effect transistor devices to be programmed to receive the voltage from the charge pump means one group after another until the data word has been programmed.

15. An arrangement for providing storage of data as claimed in claim 13 in which the selected number is four.

16. An arrangement for providing storage of data as claimed in claim 13 in which the control means includes application specific logic means which allows groups of the selected number of floating gate field effect transistor devices to be programmed to receive the voltage from the charge pump means one group after another until the data word has been programmed.

17. A method for programming a flash EEPROM memory array including a plurality of floating gate field effect transistor devices comprising the steps of:
providing a first positive voltage,
comparing each bit of a data word to be programmed with a predetermined voltage to determine which bits of the data word are to be programmed,
enabling a selected group of bitlines in response to results of comparing to transfer the first positive voltage to a selected number of the plurality of floating gate field effect transistor devices coupled to the selected group of bitlines for programming, and repeating each of the foregoing steps until all bits of the data word have been programmed.

18. A method as claimed in claim 17 which includes, after the step of enabling, the further step of determining whether additional bits exist in the word which are to be programmed but have not yet been programmed.

19. A method as claimed in claim 17 which includes the further step of verifying that all bits of a selected word have been programmed.

* * * * *

UNITED STATES PATENT AND TRADEMARK OFFICE
CERTIFICATE OF CORRECTION

PATENT NO. : 5,430,674
DATED : July 4, 1995
INVENTOR(S) : Johnny Javanifard It is certified that error appears in the above-identified patent and that said Letters Patent is hereby corrected as shown below:

In column 7 at line 3 delete "dock" and insert --clock--

In column 7 at line 22 delete "anti" and insert --and--

In column 10 at line 25 delete "so" and insert --also--

In column 11 at line 8 delete "yhe" and insert --the--

Signed and Sealed this

Thirty-first Day of December, 1996

Attest:

BRUCE LEHMAN

*Attesting Officer*     *Commissioner of Patents and Trademarks*